United States Patent
Myeong et al.

(10) Patent No.: US 10,198,041 B2
(45) Date of Patent: Feb. 5, 2019

(54) FOLDABLE DISPLAY DEVICE

(71) Applicant: Samsung Display Co., Ltd., Yongin-Si, Gyeonggi-Do (KR)

(72) Inventors: Man Sik Myeong, Seoul (KR); Ah-Ram Lee, Cheonan-si (KR); In Seo Kee, Asan-si (KR); Han Sun Ryou, Seoul (KR); Sung Chul Choi, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/672,721

(22) Filed: Aug. 9, 2017

(65) Prior Publication Data

US 2018/0101200 A1    Apr. 12, 2018

(30) Foreign Application Priority Data

Oct. 7, 2016    (KR) .......................... 10-2016-0129963

(51) Int. Cl.
   *G06F 1/16* (2006.01)
   *G02F 1/1333* (2006.01)
   *G09F 9/30* (2006.01)
   *H01L 51/00* (2006.01)

(52) U.S. Cl.
   CPC ...... *G06F 1/1652* (2013.01); *G02F 1/133305* (2013.01); *G06F 1/1681* (2013.01); *G09F 9/301* (2013.01); *H01L 51/0097* (2013.01)

(58) Field of Classification Search
   CPC .............................. G06F 1/1652; G06F 1/1681
   See application file for complete search history.

(56) References Cited

U.S. PATENT DOCUMENTS

| 8,804,324 | B2 * | 8/2014 | Bohn | G06F 1/1616 |
| | | | | 345/1.1 |
| 9,064,431 | B2 * | 6/2015 | Ahn | G06F 1/1616 |
| 9,348,370 | B2 * | 5/2016 | Song | G06F 1/1681 |

(Continued)

FOREIGN PATENT DOCUMENTS

| CN | 104851369 A | 8/2015 |
| KR | 10-2014-0026547 A | 3/2014 |

(Continued)

OTHER PUBLICATIONS

Extended European Search Report corresponding to EP Application No. 17190634.0, dated Feb. 23, 2018, 10 pages.

*Primary Examiner* — Adrian S Wilson
(74) *Attorney, Agent, or Firm* — Innovation Counsel LLP

(57) ABSTRACT

A foldable display device includes a display panel and a panel supporting unit. The display panel has a first surface in which a display unit is positioned and a second surface opposite to the first surface and including a bendable region. A panel supporting unit faces the second surface and is coupled to the display panel. The panel supporting unit includes a plurality of link members arranged in parallel along a first direction by corresponding to the bendable region of the display panel in an unfolded state, each of the plurality of link members respectively having a first supporting surface facing the display panel and coupled to be rotated about two rotational axes in a folded state. The two rotational axes of each of the plurality of link members are separated from the first supporting surface in a direction from the second surface toward the first surface.

22 Claims, 14 Drawing Sheets

(56) References Cited

U.S. PATENT DOCUMENTS

| | | | |
|---|---|---|---|
| 9,506,279 B2 * | 11/2016 | Kauhaniemi | G06F 1/1652 |
| 9,600,035 B2 * | 3/2017 | Park | G06F 1/1681 |
| 9,818,961 B2 * | 11/2017 | Hiroki | H01L 51/0097 |
| 9,918,396 B2 * | 3/2018 | Han | H05K 5/0217 |
| 2008/0055831 A1 | 3/2008 | Satoh | |
| 2010/0238612 A1 | 9/2010 | Hsiao et al. | |
| 2012/0307423 A1 | 12/2012 | Bohn et al. | |
| 2013/0037228 A1 | 2/2013 | Verschoor et al. | |
| 2016/0135324 A1 | 5/2016 | Lee et al. | |
| 2016/0139634 A1 | 5/2016 | Cho et al. | |

FOREIGN PATENT DOCUMENTS

| | | |
|---|---|---|
| KR | 10-2015-0092773 A | 8/2015 |
| KR | 10-2016-0009726 A | 1/2016 |
| KR | 10-2016-0017843 A | 2/2016 |
| WO | WO2004-047059 A1 | 6/2004 |
| WO | 2012/167204 A2 | 12/2012 |
| WO | WO2015-100404 A1 | 7/2015 |

* cited by examiner

FOLDABLE DISPLAY DEVICE

RELATED APPLICATIONS

This application claims priority to and the benefit of Korean Patent Application No. 10-2016-0129963 filed in the Korean Intellectual Property Office on Oct. 7, 2016, the disclosure of which is incorporated herein by reference in its entirety.

BACKGROUND

1. Field

The present disclosure relates to a foldable display device. More particularly, the present disclosure relates to a structure of a panel supporting unit coupled to a display panel.

2. Description of the Related Art

A flexible display panel includes a flexible substrate and a display unit disposed on the flexible substrate to impart an easy bending property. Recently, a foldable display device capable of being bent or folded in half has been under development by using the flexible display panel.

The foldable display device includes the flexible display panel and a panel supporting unit that is coupled to the flexible display panel. The panel supporting unit has a structure to allow the flexible display panel to be bent or folded. The panel supporting unit must stably support the flexible display panel without deforming the flexible display panel in a folded state.

The above information disclosed in this Background section is for enhancement of understanding of the background of the present disclosure and therefore it may contain information that may not form a prior art that is known to a person of ordinary skill in the art.

SUMMARY

The present disclosure provides a foldable display device reducing a stress applied to the flexible display panel in a folded state.

A foldable display device according to an exemplary embodiment includes a display panel and a panel supporting unit. The display panel has a first surface in which a display unit is positioned, and a second surface opposite to the first surface and including a bendable region. A panel supporting unit faces a second surface and is coupled to the display panel. The panel supporting unit includes a plurality of link members arranged in parallel along a first direction by corresponding to the bendable region of the display panel in an unfolded state. Each of the plurality of link members has a first supporting surface facing the display panel and is coupled to be rotated about two rotational axes in a folded state. The two rotational axes of each of the plurality of link members are separated from the first supporting surface in a direction from the second surface toward the first surface.

A plurality of first supporting surfaces included in the plurality of link members may be separated from each other in the unfolded state, and a distance between the two rotational axes of each of the plurality of link members may be larger than a width of the first supporting surface. Each of the plurality of link members may further include two lower inclination surfaces positioned under both end parts of the first supporting surface and connected to the first supporting surface, and two first protrusion parts positioned at both end parts of the first supporting surface along a second direction crossing the first direction.

Each of the two first protrusion parts may include two upper inclination surfaces positioned on the same plane as the two lower inclination surfaces on a cross-section, and the two rotational axes may be positioned at an upper end part of the two upper inclination surfaces. Each of the two first protrusion parts may further include two vertical surfaces positioned on the two upper inclination surfaces, and the two vertical surfaces in the unfolded state may be in contact with the vertical surfaces of the first protrusion parts of adjacent link members that are adjacent along the first direction.

In the folded state, the plurality of first supporting surfaces may be connected to each other, the two lower inclination surfaces may be in close contact with the lower inclination surfaces of adjacent link members, and the bendable region may be bent in a circular arc shape.

The display panel may further include two flat regions positioned at both sides of the bendable region, and the panel supporting unit may further include two supporting plates corresponding to the two flat regions. Each of the two supporting plates may include a second supporting surface facing the display panel, and two second protrusion parts positioned at both end parts of the second supporting surface along the second direction. The two second protrusion parts and a plurality of first protrusion parts included in the plurality of link member may be mutually connected by a respective rotation coupling part having a rotational axis.

In the unfolded state, the two second supporting surfaces may be parallel to the plurality of first supporting surfaces, and in the folded state, an edge of an outermost first supporting surface among the plurality of first supporting surfaces may be separated from the second supporting surface toward a curvature center of the bendable region. In the folded state, the plurality of first supporting surfaces may be positioned inside of an imaginary circular arc connecting the two second supporting surfaces.

The two second protrusion parts may be positioned to face each other outside both sides of the display panel, and the plurality of first protrusion parts may be positioned to face each other outside both sides of the display panel. The upper surface of the first protrusion part and the upper surface of the second protrusion part may be separated from the first surface in the direction from the second surface toward the first surface.

The plurality of first supporting surfaces may respectively include a center surface and two chamfered surfaces positioned at both sides of the center surface. The two chamfered surfaces may have the same width and the same chamfer angle.

The panel supporting unit may further include a center supporting plate, and the plurality of link members may be positioned at both sides of the center supporting plate. The center supporting plate may include a third supporting surface facing the display panel, and two third protrusion parts positioned at both end parts of the third supporting surface along the second direction. The two third protrusion parts and the plurality of first protrusion parts may be mutually coupled by a respective rotation coupling part having the rotational axis.

In the unfolded state, the third supporting surface may be parallel to the plurality of first supporting surfaces, and in the folded state, the edge of the first supporting surface in contact with the third supporting surface among the plurality of first supporting surfaces may be separated from the third supporting surface toward a curvature center of the bendable region. In the folded state, the plurality of first supporting surfaces may be positioned inside an imaginary circular arc connecting the second supporting surface and the third supporting surface.

Each of the plurality of first supporting surfaces may include a center surface and two chamfered surfaces positioned at both sides of the center surface. The two chamfered surfaces may have the same width and the same chamfer angle.

A foldable display device according to another an exemplary embodiment includes a display panel and a panel supporting unit. The display panel has a first surface in which a display unit is positioned and a second surface opposite to the first surface, and includes a bendable region. A panel supporting unit faces the second surface and is coupled to the display panel. The panel supporting unit includes a plurality of link members arranged in parallel along a first direction by corresponding to the bendable region of the display panel in an unfolded state, each of the plurality of link members respectively coupled to be rotated about two rotational axes in a folded state. The two rotational axes of each of the plurality of link members may be separated from the first surface in a direction from the second surface toward the first surface.

The two rotational axes may be positioned outside both sides of the display panel along a second direction crossing the first direction.

According to exemplary embodiments, in the folded state, a plurality of link members can reduce a deformation of the display panel and decrease a probability of damaging the display panel. In addition, the first protrusion part and the second protrusion part of the panel supporting unit can serve as protection members of the display panel and suppress the damage of the display panel due to an external impact.

DETAILED DESCRIPTION

Figure 1:
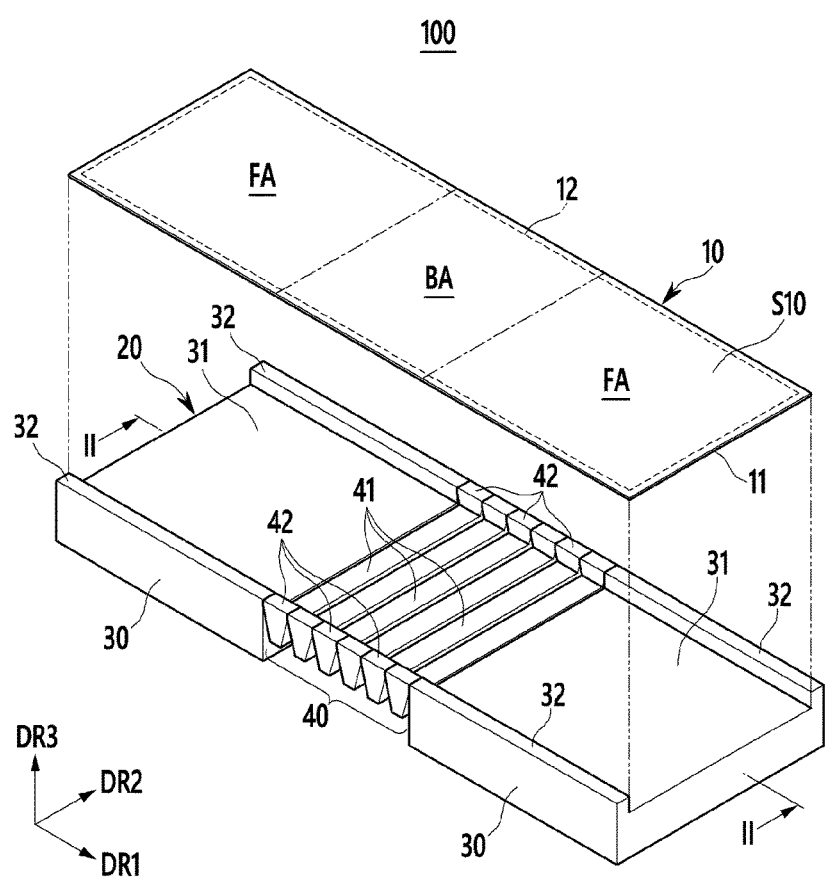
FIG. 1 is an exploded perspective view of an unfolded state of a foldable display device, according to a first exemplary embodiment.

The present disclosure will be described more fully hereinafter with reference to the accompanying drawings, in which exemplary embodiments of the present disclosure are shown. As those skilled in the art would realize, the described embodiments may be modified in various different ways, without departing from the spirit or scope of the present disclosure.

Descriptions of parts not related to the present disclosure may be omitted, and like reference numerals designate like elements throughout the specification.

Further, since sizes and thicknesses of constituent members shown in the accompanying drawings may be arbitrarily given for better understanding and ease of description, the present disclosure is not limited to the illustrated sizes and thicknesses. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or one or more intervening elements may be present. In contrast, when an element is referred to as being "directly on" another element, there may be no intervening element present.

Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from a side.

Figure 2:
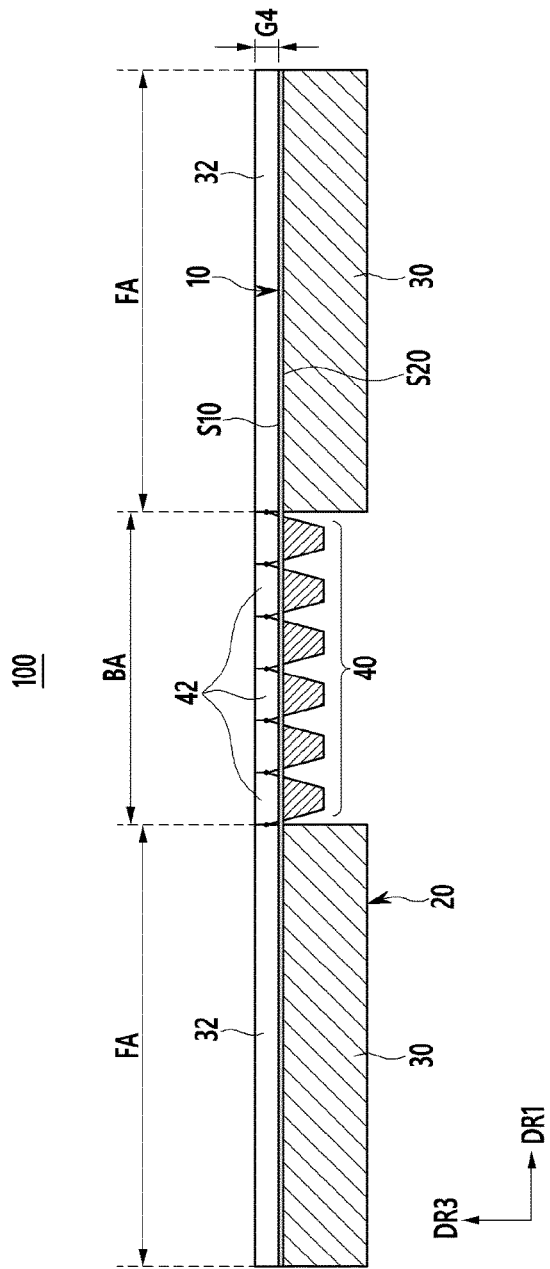
FIG. 2 is a cross-sectional view of a foldable display device of FIG. 1 taken along a line II-II.

FIG. 1 is an exploded perspective view of an unfolded state of a foldable display device, according to a first exemplary embodiment. FIG. 2 is a cross-sectional view of a foldable display device of FIG. 1 taken along a line II-II, and FIG. 3 is a partially enlarged view of FIG. 2.

Figure 3:
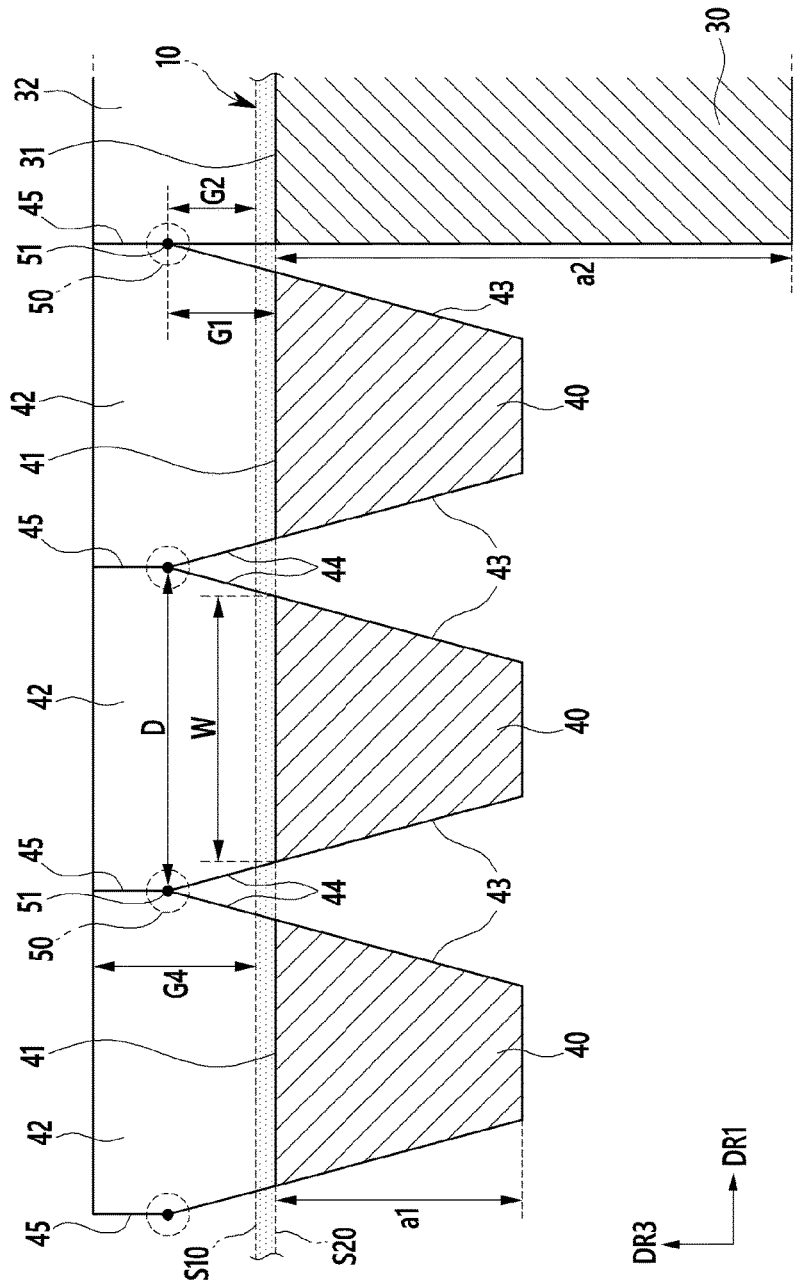
FIG. 3 is a partially enlarged view of FIG. 2.

Referring to FIG. 1 to FIG. 3, the foldable display device 100 of the first exemplary embodiment includes a display panel 10 and a panel supporting unit 20 coupled to and supporting the display panel 10.

The display panel 10 includes a flexible substrate 11 and a display unit 12 positioned on the flexible substrate 11. The display panel 10, for example, may be one among an organic light emitting panel, a liquid crystal panel, and an electrophoretic display panel.

The display panel 10 includes a first surface S10 on which the display unit 12 is positioned and a second surface S20 that is opposite to the first surface S10. The first surface S10 may be a display surface and the second surface S20 may be the display surface or a non-display surface. Referring to FIG. 1, an upper surface of the display panel 10 becomes the first surface S10, and a lower surface of the display panel 10 becomes the second surface S20.

The display panel 10 is divided into a flat region FA and a bendable region BA. For example, the display panel 10 may be divided into the bendable region BA positioned at a center and two flat regions FA positioned at respective sides of the bendable region BA. Lengths of two flat regions FA along a first direction DR1 may be equal to each other or different from each other.

The panel supporting unit 20 faces the second surface S20 of the display panel 10 and is coupled to the display panel 10. The panel supporting unit 20 may include two supporting plates 30 corresponding to the two flat regions FA, and a plurality of link members 40 corresponding to the bendable region BA.

The plurality of link members 40 may be arranged in parallel along the first direction DR1, and each of the plurality of link members 40 may have a bar shape extending along a second direction DR2 crossing the first direction DR1. Referring to FIG. 3, each vertical width a1 of the plurality of link members 40 observed on a cross-sectional view may be smaller than a vertical width a2 of the supporting plate 30.

Each of the plurality of link members 40 has a first supporting surface 41 facing the display panel 10, and each of the two supporting plates 30 has a second supporting surface 31 facing the display panel 10. The bendable region BA of the display panel 10 is positioned on the plurality of first supporting surfaces 41, and the flat regions FA are positioned on the two second supporting surfaces 31. In the unfolded state, the plurality of first supporting surfaces 41 and the two second supporting surfaces 31 extend in parallel along the first direction DR1 and have the same height.

The flat region FA of the display panel 10 may be adhered to the second supporting surface 31 of the supporting plate 30 by an adhesion layer (not shown). In contrast, the bendable region BA of the display panel 10 is not adhered to the plurality of link members 40. That is, the flat region FA of the display panel 10 is fixed to the second supporting surface 31, however the bendable region BA may be in contact with the plurality of first supporting surfaces 41 without being adhered thereto or may be slightly floated from the plurality of first supporting surfaces 41.

Each of the plurality of link members 40 may include a first protrusion part 42 protruded upward from both end parts along the second direction DR2. The supporting plate 30 may include a second protrusion part 32 protruded upward from both end parts along the second direction DR2. The first protrusion part 42 and the second protrusion part 32 do not overlap the display panel 10, and may be positioned outside of the longitudinal sides of the display panel 10.

Here, the expression "protruded upward" means to be protruded along a third direction DR3 based on the drawing, and this has the same meaning as being protruded in a direction from the second surface S20 of the display panel 10 toward the first surface S10 of the display panel 10.

The plurality of first protrusion parts 42 and the two second protrusion parts 32 are mutually coupled by a plurality of rotation coupling parts 50. Each of the plurality of rotation coupling parts 50 has a rotational axis 51, and each of the plurality of link members 40 may be rotated about the two rotational axes 51 extending along the second direction DR2. The rotation coupling parts 50 may be constructed, for example, of a hinge assembly having a hinge axis. In this case, the rotational axis 51 may correspond to the hinge axis.

Figure 4:
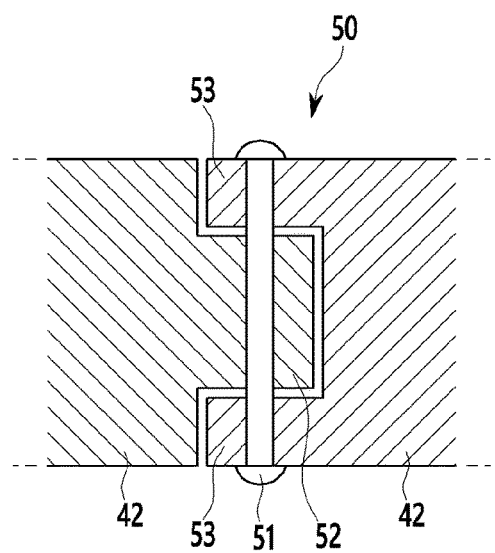
FIG. 4 is a cross-sectional view showing an example of a rotation assembly shown in FIG. 3.

FIG. 4 is a cross-sectional view showing an example of a rotation assembly shown in FIG. 3.

Referring to FIG. 4, the rotation coupling part 50 may include a first link arm 52 connected to any one first protrusion part 42, a second link arm 53 connected to an adjacent first protrusion part 42, and the rotational axis 51 that hinge-couples the first link arm 52 and the second link arm 53 by penetrating through them. The rotation coupling part 50 is not limited to the illustrated example.

Again referring to FIG. 1 to FIG. 3, each of the plurality of link members 40 includes two lower inclination surfaces 43 positioned under the first supporting surface 41. Each of the plurality of first protrusion parts 42 includes two upper inclination surfaces 44. The upper inclination surfaces 44 have the same slope as the lower inclination surfaces 43, and may be positioned on the same plane as the lower inclination surface 43 on the cross-section.

The rotational axis 51 and the rotation coupling part 50 may be positioned at an upper end part of the upper inclination surface 44. The two rotational axes 51 of a link member 40 are positioned to be higher than the first supporting surface 41, and each rotational axis 51 is positioned at a predetermined separation distance G1 (referring to FIG. 3) from the first supporting surface 41 along the third direction DR3 (matching a direction from the second surface S20 toward the first surface S10 in the unfolded state).

The separation distance G1 of the rotational axis 51 for the first supporting surface 41 is larger than the thickness of the display panel 10. Accordingly, two rotational axes 51 are positioned to be higher than the first surface S10 of the display panel 10, and each rotational axis 51 is positioned at a predetermined separation distance G2 from the first surface S10 along the third direction DR3.

In addition, in each link member 40, a distance D (referring to FIG. 3) between the two rotational axes 51 is larger than a width W (referring to FIG. 3) of the first supporting surface 41. Each of the plurality of first protrusion parts 42 may include two vertical surfaces 45 connected to the two upper inclination surfaces 44, respectively.

In the unfolded state, the vertical surface 45 is in contact with the vertical surface 45 of an adjacent first protrusion part 42, and the upper inclination surface 44 is separated from the upper inclination surface 44 of the adjacent first protrusion part 42. The plurality of first supporting surfaces 41 are separated from each other, and the lower inclination surface 43 is separated from the lower inclination surface 43 of the adjacent link member 40.

In the unfolded state, the first supporting surface 41 of an outermost link member 40 among the plurality of link members 40 is separated from the second supporting surface 31 of the supporting plate 30, and the upper inclination surface 44 and the lower inclination surface 43 of the outermost link member 40 are separated from an inner surface of the supporting plate 30.

Figure 5:
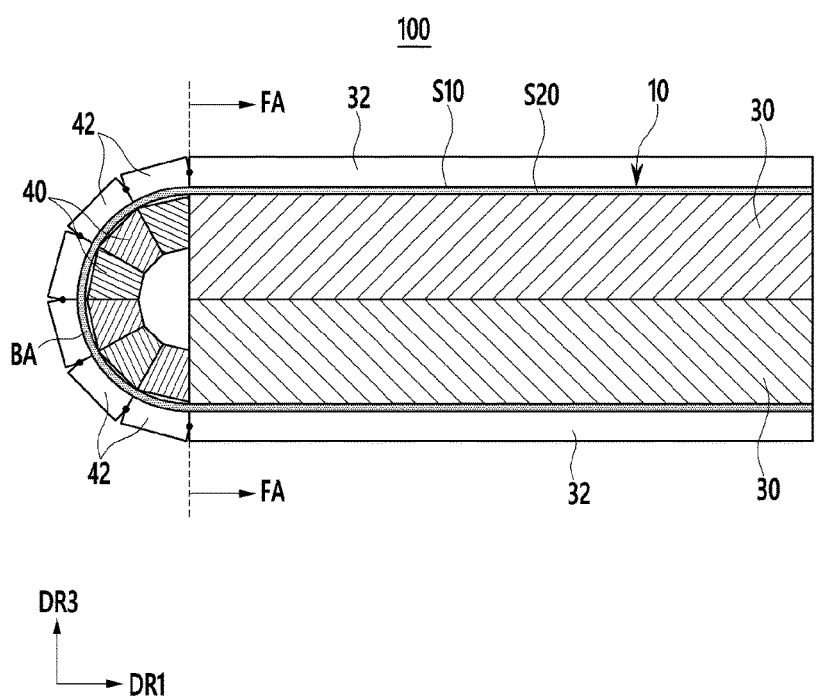
FIG. 5 is a cross-sectional view showing a folded state of the foldable display device shown in FIG. 2.
Figure 6:
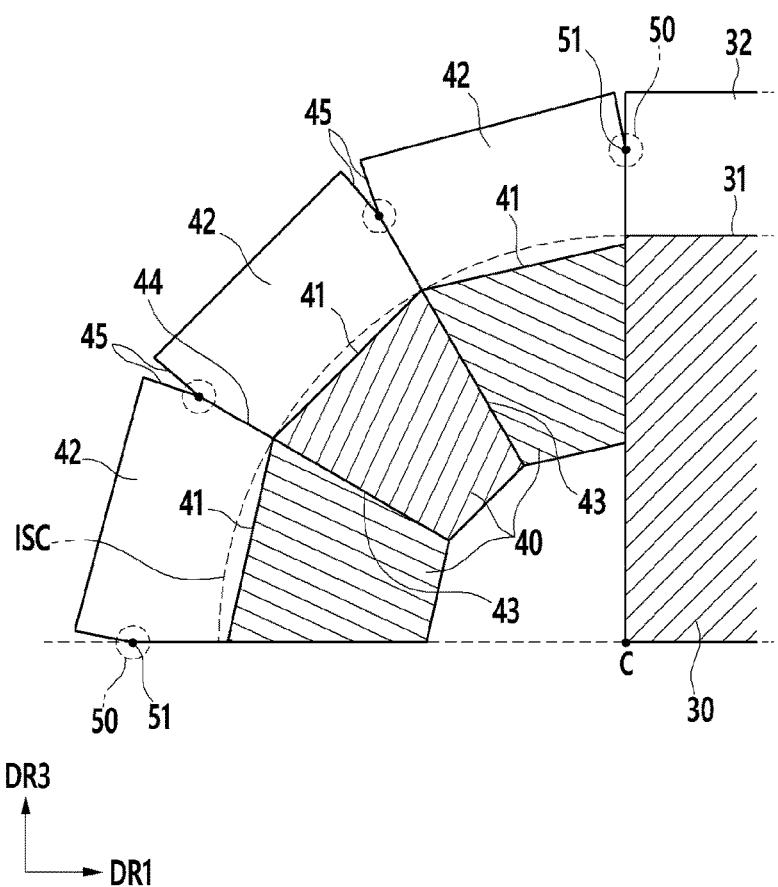
FIG. 6 is a partially enlarged view of FIG. 5.

FIG. 5 is a cross-sectional view showing a folded state of the foldable display device shown in FIG. 2. FIG. 6 is a partially enlarged view of FIG. 5, and FIG. 7 is a partially enlarged view of FIG. 6.

Figure 7:
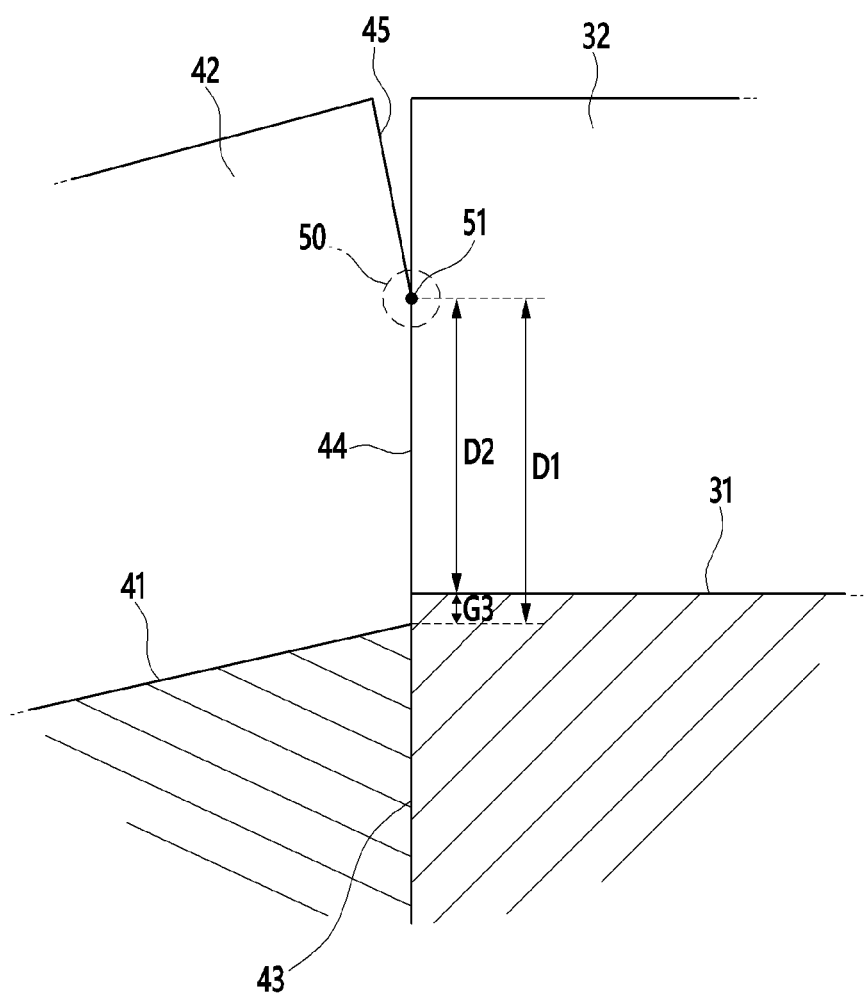
FIG. 7 is a partially enlarged view of FIG. 6.

Referring to FIG. 5 to FIG. 7, the foldable display device 100 of the first exemplary embodiment is changed to the folded state by rotating the plurality of link members 40 about their rotational axes 51, and the bendable region BA of the display panel 10 is bent in a circular arc shape. FIG. 5 shows a case in which six link members 40 are in close contact to form a semicircle on the cross-section, and the bendable region BA of the display panel 10 is bent 180°.

In the folded state, the plurality of first supporting surfaces 41 are connected to each other, the plurality of link members 40 are in contact at the lower inclination surfaces 43 to each other, and the lower inclination surface 43 of the outermost link members 40 is in contact with the inner surface of the corresponding supporting plate 30. The plurality of first protrusion parts 42 are in contact at the upper inclination surfaces 44 to each other, and the upper inclination surface 44 of the outermost first protrusion parts 42 is in contact with the inner surface of the corresponding supporting plate 30.

Further, in the folded state, the two adjacent vertical surfaces 45 are spread, and the vertical surface 45 of the outermost first protrusion parts 42 is separated from the inner surface of the corresponding supporting plate 30. An inclination angle of the lower inclination surface 43 in the plurality of link members 40 is set as a value so that the plurality of link members 40 may be in close contact to each other to form the semicircle in the folded state.

Because two rotational axes 51 are positioned to be higher than the first supporting surface 41 in each of the plurality of link member 40, an edge of the first supporting surface 41 of the outermost link member 40 in the folded state is positioned at a predetermined separation distance G3 (referring to FIG. 7) from the second supporting surface 31 of the supporting plate 30 toward a curvature center C of the bendable region BA. That is, in the folded state, the edge of the first supporting surface 41 is not in direct contact with the edge of the second supporting surface 31 and is positioned to be closer to the curvature center C of the bendable region BA than the edge of the second supporting surface 31.

For the outermost link member 40 that is connected to the supporting plate 30, a distance D1 (referring to FIG. 7) between the rotational axis 51 and the first supporting surface 41 is larger than the distance D2 (referring to FIG. 7) between the rotational axis 51 and the second supporting surface 31. The difference of the distances D1 and the D2 is represented by the above-described separation distance G3 in the folded state.

In the unfolded state, the plurality of first supporting surfaces 41 are separated from each other as shown in FIG. 3. This means that a sum of the lengths of the plurality of first supporting surfaces 41 is shorter than the length of an imaginary line connecting two second supporting surfaces 31 in the unfolded state. Accordingly, the plurality of first supporting surfaces 41 in contact with each other in the folded state may be positioned inside of an imaginary circular arc ISC (referring to FIG. 6) that connects two second supporting surfaces 31 toward the curvature center C.

For example, at least one point among a plurality of points in which two adjacent first supporting surfaces 41 are in contact may be positioned on the imaginary circular arc ISC, and the rest of the first supporting surface 41 may be positioned inside the circular arc ISC by a distance from the imaginary circular arc ISC toward the curvature center C. In the folded state, the second surface S20 of the display panel 10 in the bendable region BA may be positioned on the imaginary circular arc ISC.

As above-described, the plurality of link members 40 are pushed and positioned to the inside from the second surface S20 of the bendable region BA (in the direction toward the imaginary circular arc ISC or the curvature center C of the bendable region BA) by the above-described height difference of the rotational axis 51 and the first supporting surface 41 in the folded state. Accordingly, the plurality of link members 40 minimize a deformation of the display panel 10 without imparting an excessive stress to the display panel 10 in the folded state.

Figure 8:
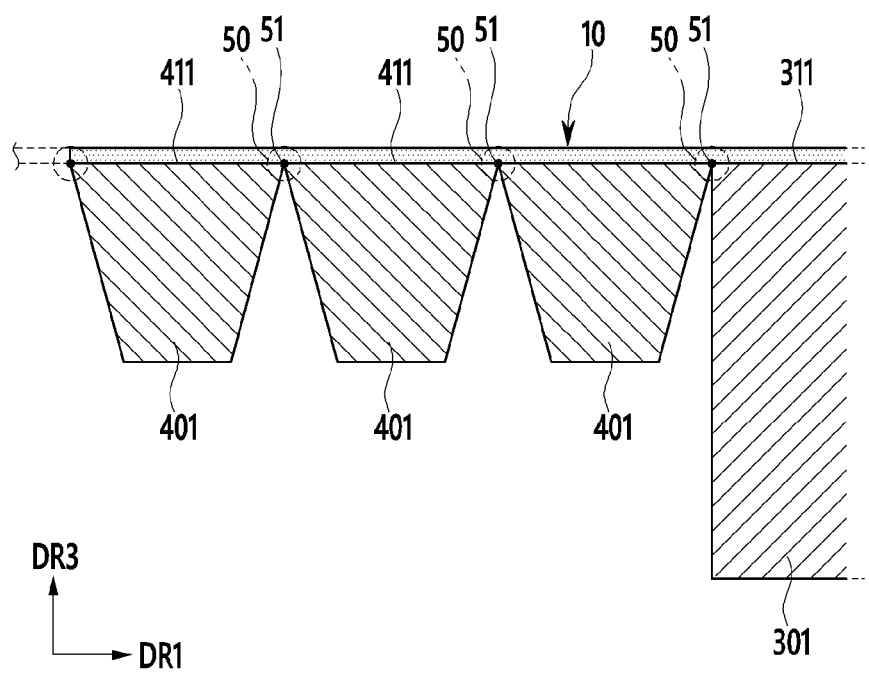
FIG. 8 is a partially enlarged cross-sectional view showing an unfolded state of a foldable display device, according to a comparative example.
Figure 9:
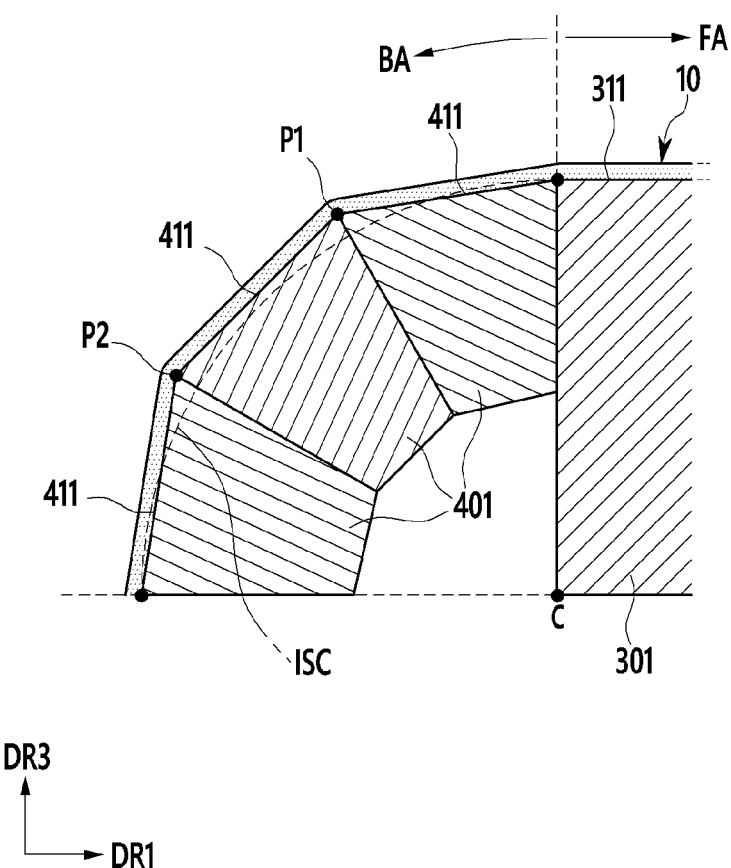
FIG. 9 is a partially enlarged cross-sectional view showing a folded state of the foldable display device shown in FIG. 8.

FIG. 8 is a partially enlarged cross-sectional view showing an unfolded state of a foldable display device, according to a comparative example, and FIG. 9 is a partially enlarged cross-sectional view showing a folded state of the foldable display device shown in FIG. 8.

Referring to FIG. 8 and FIG. 9, a plurality of link members 401 are mutually coupled by the plurality of rotation coupling parts 50 having the rotational axis 51, and each of the plurality of link members 401 may be rotated about two rotational axes 51. In the unfolded state, two rotational axes 51 are positioned at the same height as the first supporting surface 411 and the second supporting surface 311 facing the display panel 10.

In the folded state, a plurality of points P1 and P2 (referring to FIG. 9) where two adjacent first supporting surfaces 411 are in contact are positioned outside the imaginary circular arc ISC that connects the two second supporting surfaces 311. Accordingly, the plurality of link members 401 push and deform the display panel 10 in an outward direction away from the curvature center C of the imaginary circular arc ISC, particularly at the plurality of points P1 and P2 where the two adjacent first supporting surfaces 411 are in contact.

The deformation of the display panel 10 in the bendable region BA in the folded state can cause a tensile stress particularly at or near the plurality of points P1 and P2 where the two adjacent first supporting surfaces 411 are in contact. The tensile stress imparted on the display panel 10 due to the deformation of the plurality of link members 401 may increase a chance of breaking a deformation-sensitive layer of the display panel 10.

For example, the display panel 10 may have a multilayer including a flexible substrate, a display unit, an encapsulation layer, a touch sensor unit, a polarization film, a cover window, etc. In this case, a hard coating layer of the cover window or an inorganic insulating layer of the display unit may be brittle and prone to a breakage due to the tensile stress caused by the deformation in the bendable region BA. Accordingly, in the foldable display device of the comparative example, the chances are high that a certain layer of the display panel 10 may be damaged by the stress in the bendable region BA in the folded state.

In contrast, the foldable display device 100 of the first exemplary embodiment shown in FIGS. 1 to 7 minimizes the amount of deformation that may be caused by the plurality of link members 40 pushing the display panel 10 due to the height difference of the rotational axis 51 and the first supporting surface 41 in the folded state. The height difference decreases the chance of breaking layers of the display panel 10, thereby increasing the durability of the display panel 10.

In addition, in the foldable display device 100 of the first exemplary embodiment, the upper surface of the first protrusion part 42 and the second protrusion part 32 is positioned to be higher than the first surface S10 of the display panel 10. That is, in the unfolded state, the upper surface of the first protrusion part 42 and the second protrusion part 32 are positioned at a predetermined separation distance G4 (referring to FIG. 2 and FIG. 3) from the first surface S10 of the display panel 10 along the third direction DR3.

When an external impact such as a drop impact is applied to the foldable display device 100, the external impact may be firstly absorbed by the first protrusion part 42 and the second protrusion part 32 that are protruded above the display panel 10. In this case, the first protrusion part 42 and the second protrusion part 32 serve as protection members of the display panel 10 that can suppress the damage of the display panel 10 caused by the external impact.

Figure 10:
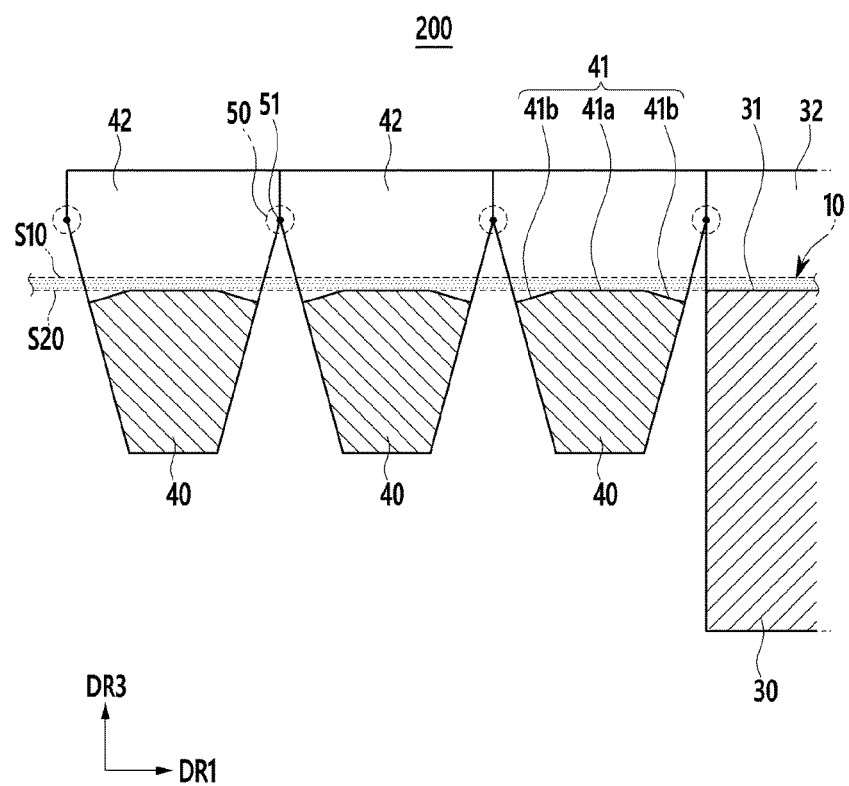
FIG. 10 is a partially enlarged cross-sectional view showing an unfolded state of a foldable display device, according to a second exemplary embodiment.
Figure 11:
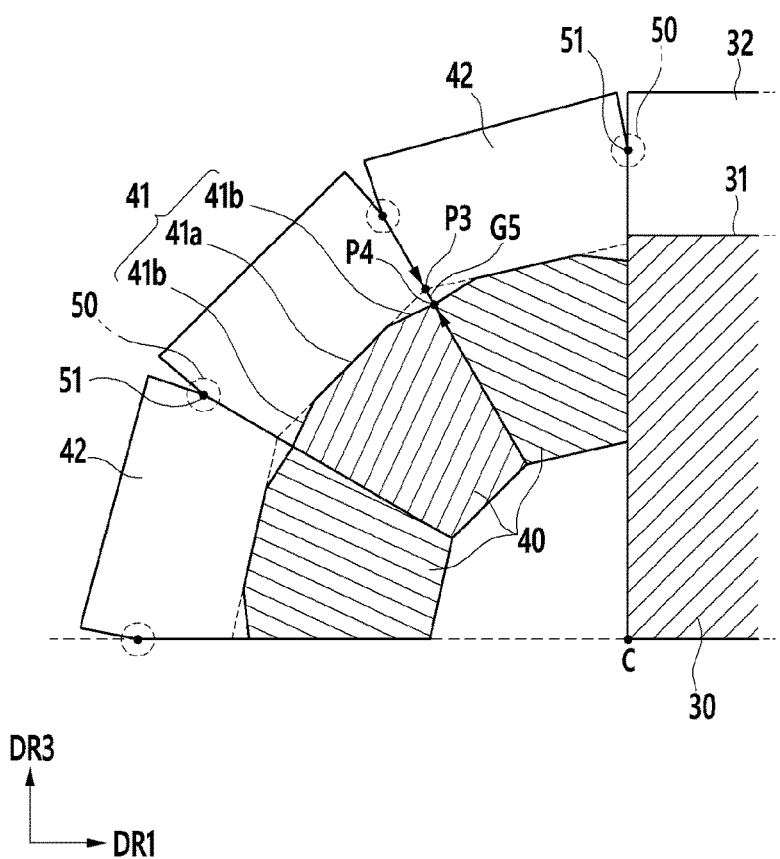
FIG. 11 is a view showing a folded state of the foldable display device shown in FIG. 10.

FIG. 10 is a partially enlarged cross-sectional view showing an unfolded state of a foldable display device, according to a second exemplary embodiment, and FIG. 11 is a view showing the folded state of a foldable display device shown in FIG. 10.

Referring to FIG. 10 and FIG. 11, in the foldable display device 200 of the second exemplary embodiment, each of a plurality of first supporting surfaces 41 includes two chamfered surfaces 41b positioned at both edges thereof.

In the unfolded state, each of the plurality of first supporting surfaces 41 may include a center surface 41a parallel to the first direction DR1, and the two chamfered surfaces 41b positioned at respective sides of the center surface 41a. The widths of the two chamfered surfaces 41b may be equal to each other, and a chamfer angle of the two chamfered surfaces 41b may be equal to each other. In this case, the plurality of first supporting surfaces 41 are right and left symmetrical.

Because each of the plurality of first supporting surfaces 41 includes the two chamfered surfaces 41b, a plurality of points where two adjacent first supporting surfaces 41 are in contact in the folded state are positioned to be closer to the curvature center C than in the above-described first exemplary embodiment.

Referring to FIG. 11, in the case of the first exemplary embodiment two adjacent first supporting surfaces 41 are in contact at the point P3 in the folded state whereas, in the case of the second exemplary embodiment, two adjacent first supporting surface 41 are in contact at the point P4 in the folded state. The point P4 is positioned to be closer to the curvature center C than the point P3.

The foldable display device 200 of the second exemplary embodiment may separate the first supporting surface 41 of the link member 40 from the display panel 10 by the distance G5 between the point P3 and the point P4. Accordingly, the plurality of link members 40 may further reduce the deformation of the display panel 10 in the folded state and may minimize the stress imparted on the display panel 10.

The foldable display device 200 of the second exemplary embodiment is made of the same configurations as or similar to the first exemplary embodiment except for each first supporting surface 41 of the plurality of link members 40 including two chamfered surfaces 41b.

Figure 12:
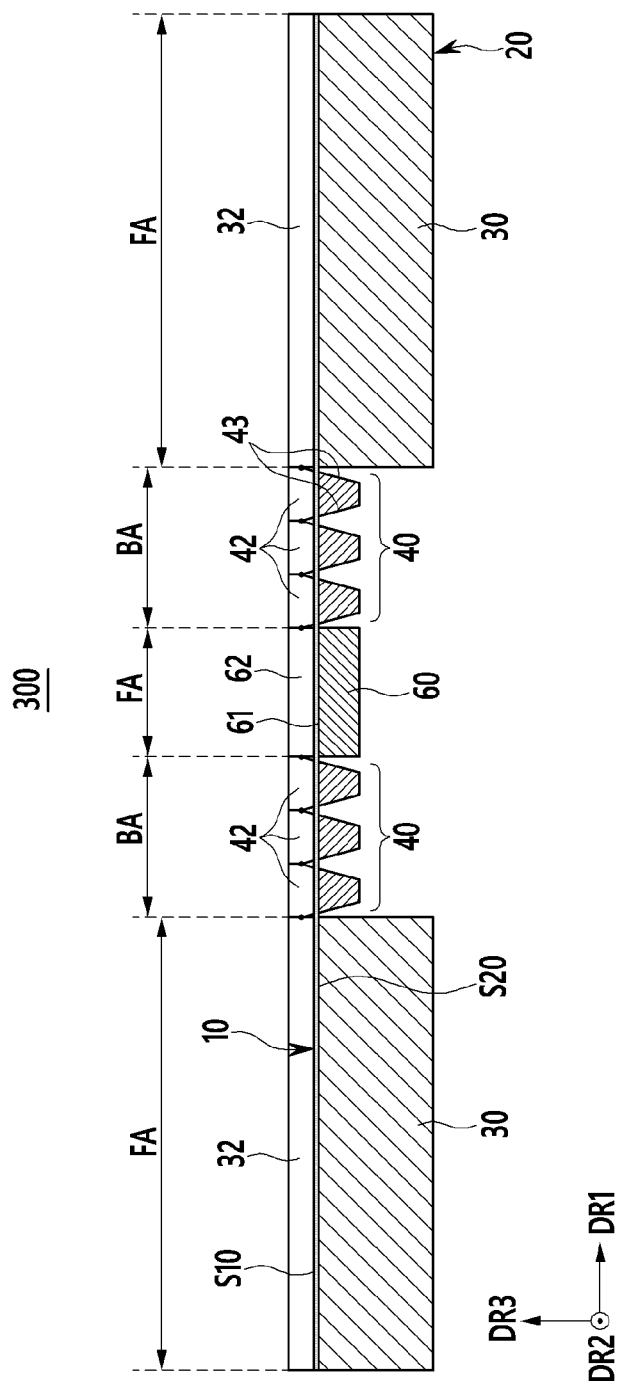
FIG. 12 is a cross-sectional view showing an unfolded state of a foldable display device, according to a third exemplary embodiment.
Figure 13:
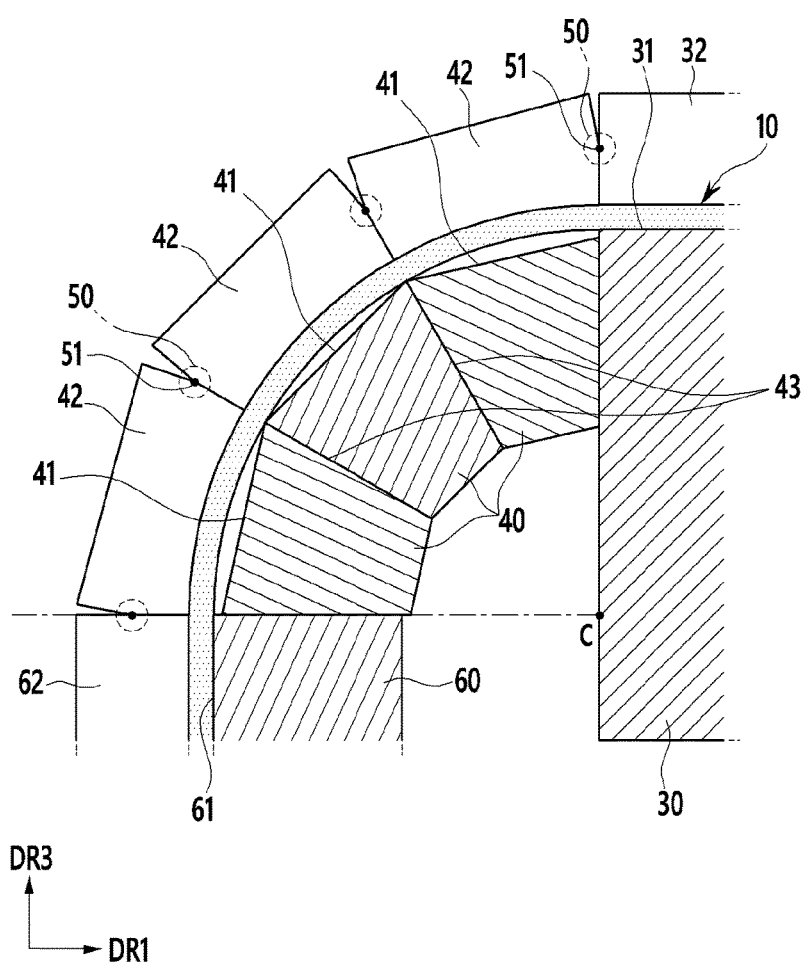
FIG. 13 is a partially enlarged view showing a folded state of the foldable display device shown in FIG. 12.

FIG. 12 is a cross-sectional view showing an unfolded state of a foldable display device, according to a third exemplary embodiment, and FIG. 13 is a partially enlarged view showing a folded state of the foldable display device shown in FIG. 12.

Referring to FIG. 12 and FIG. 13, in the foldable display device 300 of the third exemplary embodiment, the panel supporting unit 20 includes a center supporting plate 60 positioned between the plurality of link members 40. The center supporting plate 60 is positioned at the center of the panel supporting unit 20, and the plurality of link members 40 and two supporting plates 30 may be disposed symmetrically right and left with respect to the center supporting plate 60.

The center supporting plate 60 includes a third supporting surface 61 facing the display panel 10 and a third protrusion part 62 protruded upward from both end parts of the center supporting plate 60 in the second direction DR2.

The first protrusion parts 42, and the two second protrusion parts 32, and the third protrusion part 62, are mutually coupled by a plurality of rotation coupling parts 50. Each of the plurality of rotation coupling parts 50 includes the rotational axis 51, and each of the plurality of link members 40 may be rotated about two rotational axes 51 extending along the second direction DR2.

In the folded state, the plurality of link members 40 are in contact at the lower inclination surface 43 to each other, and the plurality of first supporting surfaces 41 correspond to the circular arc of 90° connecting the supporting plate 30 and the center supporting plate 60. The display panel 10 may be divided into three flat regions FA corresponding to the center supporting plate 60 and two supporting plates 30, and two bendable regions BA corresponding to the plurality of link members 40.

The foldable display device 300 according to the third exemplary embodiment has the same as or similar configurations to the first exemplary embodiment except for the center supporting plate 60 positioned between the plurality of link members 40.

Figure 14:
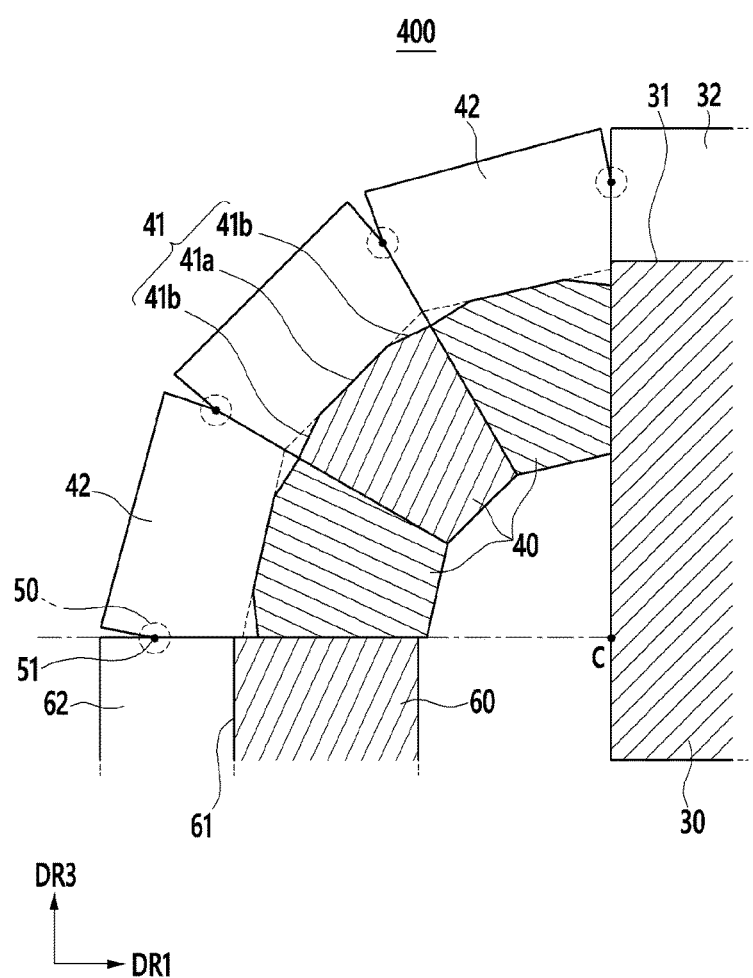
FIG. 14 is a partially enlarged cross-sectional view showing a folded state of a foldable display device, according to a fourth exemplary embodiment.

FIG. 14 is a partially enlarged cross-sectional view showing a folded state of a foldable display device, according to a fourth exemplary embodiment.

Referring to FIG. 14, in the foldable display device 400 according to the fourth exemplary embodiment, each of the plurality of first supporting surfaces 41 includes two chamfered surfaces 41b positioned at respective edges thereof. That is, each of the plurality of first supporting surfaces 41 includes a center surface 41a parallel to the first direction DR1 in the unfolded state and two chamfered surfaces 41b positioned at respective sides of the center surface 41a.

The operation of the chamfered surface 41b is the same as described above in the second exemplary embodiment. The foldable display device 400 of the fourth exemplary embodiment has the same or similar configuration to the third exemplary embodiment except for each of the plurality of first supporting surfaces 41 including two chamfered surfaces 41b.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims.

What is claimed is:
1. A foldable display device comprising:
a display panel having a first surface in which a display unit is positioned and a second surface opposite to the first surface and including a bendable region; and
a panel supporting unit facing the second surface and coupled to the display panel,
wherein the panel supporting unit includes a plurality of link members arranged in parallel along a first direction by corresponding to the bendable region of the display panel in an unfolded state, each of the plurality of link members respectively having a first supporting surface corresponding to the second surface of the display panel and coupled to be rotated about two rotational axes in a folded state, and
wherein the two rotational axes of each of the plurality of link members are separated from the first supporting surface in a direction opposite from the plurality of link members, and the display panel is disposed, when coupled to the panel supporting unit, between the two rotational axes and the first supporting surface in a cross-sectional view.

2. The foldable display device of claim 1, wherein
a plurality of first supporting surfaces included in the plurality of link members are separated from each other in the unfolded state, and
a distance between the two rotational axes of each of the plurality of link members is larger than a width of the first supporting surface.

3. The foldable display device of claim 2, wherein
each of the plurality of link members includes two lower inclination surfaces positioned under both end parts of the first supporting surface and connected to the first supporting surface, and two first protrusion parts positioned at both end parts of the first supporting surface along a second direction crossing the first direction.

4. The foldable display device of claim 3, wherein
each of the two first protrusion parts includes two upper inclination surfaces positioned on the same plane as the two lower inclination surfaces on a cross-section, and
the two rotational axes are positioned at an upper end part of the two upper inclination surfaces.

5. The foldable display device of claim 4, wherein
each of the two first protrusion parts further includes two vertical surfaces positioned on the two upper inclination surfaces, and
the two vertical surfaces in the unfolded state are in contact with the vertical surfaces of the first protrusion parts of adjacent link members that are adjacent along the first direction.

6. The foldable display device of claim 4, wherein
in the folded state, the plurality of first supporting surfaces are connected to each other, the two lower inclination surfaces are in close contact with the lower inclination surfaces of adjacent link members, and the bendable region is bent in a circular arc shape.

7. The foldable display device of claim 4, wherein
the display panel further includes two flat regions positioned at both sides of the bendable region, and
the panel supporting unit further includes two supporting plates corresponding to the two flat regions.

8. The foldable display device of claim 7, wherein
each of the two supporting plates includes a second supporting surface facing the display panel and two second protrusion parts positioned at both end parts of the second supporting surface along the second direction, and
the two second protrusion parts and a plurality of first protrusion parts included in the plurality of link member are mutually connected by a respective rotation coupling part having a rotational axis.

9. The foldable display device of claim 8, wherein
in the unfolded state, the two second supporting surfaces are parallel to the plurality of first supporting surfaces, and
in the folded state, an edge of an outermost first supporting surface among the plurality of first supporting surfaces is separated from the second supporting surface toward a curvature center of the bendable region.

10. The foldable display device of claim 9, wherein
in the folded state, the plurality of first supporting surfaces are positioned inside of an imaginary circular arc connecting the two second supporting surfaces.

11. The foldable display device of claim 8, wherein
the two second protrusion parts are positioned to face each other outside both sides of the display panel, and
the plurality of first protrusion parts are positioned to face each other outside both sides of the display panel.

12. The foldable display device of claim 8, wherein
the upper surface of the first protrusion part and the upper surface of the second protrusion part are separated from the first surface in the direction from the second surface toward the first surface.

13. The foldable display device of claim 4, wherein
the plurality of first supporting surfaces respectively include a center surface and two chamfered surfaces positioned at both sides of the center surface.

14. The foldable display device of claim 13, wherein
the two chamfered surfaces have the same width and the same chamfer angle.

15. The foldable display device of claim 8, wherein
the panel supporting unit further includes a center supporting plate, and
the plurality of link members are positioned at both sides of the center supporting plate.

16. The foldable display device of claim 15, wherein
the center supporting plate includes a third supporting surface facing the display panel and two third protrusion parts positioned at both end parts of the third supporting surface along the second direction, and
the two third protrusion parts and the plurality of first protrusion parts are mutually coupled by a respective rotation coupling part having the rotational axis.

17. The foldable display device of claim 16, wherein,
in the unfolded state, the third supporting surface is parallel to the plurality of first supporting surfaces, and
in the folded state, the edge of the first supporting surface in contact with the third supporting surface among the plurality of first supporting surfaces is separated from the third supporting surface toward a curvature center of the bendable region.

18. The foldable display device of claim 17, wherein
in the folded state, the plurality of first supporting surfaces are positioned inside an imaginary circular arc connecting the second supporting surface and the third supporting surface.

19. The foldable display device of claim 15, wherein
each of the plurality of first supporting surfaces includes a center surface and two chamfered surfaces positioned at both sides of the center surface.

20. The foldable display device of claim 19, wherein
the two chamfered surfaces have the same width and the same chamfer angle.

21. A foldable display device comprising:
a display panel having a first surface in which a display unit is positioned and a second surface opposite to the first surface and including a bendable region; and
a panel supporting unit facing the second surface and coupled to the display panel,
wherein the panel supporting unit includes a plurality of link members arranged in parallel along a first direction by corresponding to the bendable region of the display panel in an unfolded state, each of the plurality of link members respectively coupled to be rotated about two rotational axes in a folded state, and
wherein the two rotational axes of each of the plurality of link members are separated from the first surface in a direction opposite from the plurality of link members, and the first surface of the display panel is disposed, when coupled to the panel supporting unit, between the two rotational axes and the second surface in a cross-sectional view.

22. The foldable display device of claim 21, wherein the two rotational axes are positioned outside both sides of the display panel along a second direction crossing the first direction.

\* \* \* \* \*